(12) United States Patent
Buda et al.

(10) Patent No.: US 6,993,053 B2
(45) Date of Patent: Jan. 31, 2006

(54) THIN CLAD DIODE LASER

(75) Inventors: Manuela Buda, Canberra (AU); Jillian Alice Hay, Christchurch (NZ); Hark Hoe Tan, Grarran (AU); Chennupati Jagadish, Evatt (AU)

(73) Assignee: The Australian National University, Australian Capital Territory (AU)

( * ) Notice: Subject to any disclaimer, the term of this patent is extended or adjusted under 35 U.S.C. 154(b) by 188 days.

(21) Appl. No.: 10/406,806

(22) Filed: Apr. 3, 2003

(65) Prior Publication Data

US 2004/0028104 A1 Feb. 12, 2004

(30) Foreign Application Priority Data

Apr. 3, 2002 (AU) ........................ PS1506
Apr. 3, 2002 (AU) ........................ PS1507

(51) Int. Cl.
   *H01S 5/00* (2006.01)

(52) U.S. Cl. ................ 372/44.01; 372/45.01; 372/46.01; 372/87

(58) Field of Classification Search ........... 372/44–46, 372/87; 257/753
   See application file for complete search history.

(56) References Cited

U.S. PATENT DOCUMENTS

| | | | |
|---|---|---|---|
| 4,328,469 A | 5/1982 | Scifres et al. ................. 372/45 |
| 5,197,077 A | 3/1993 | Harding et al. ............... 372/45 |
| 5,260,959 A | 11/1993 | Hayakawa .................... 372/45 |
| 5,289,484 A | 2/1994 | Hayakawa .................... 372/45 |
| 5,309,465 A | 5/1994 | Antreasyan et al. .......... 372/43 |
| 5,594,749 A | 1/1997 | Behfar-Rad et al. ........... 372/45 |
| 5,815,521 A | 9/1998 | Hobson et al. ................ 372/45 |
| 6,084,899 A * | 7/2000 | Shakuda ....................... 372/45 |
| 6,167,072 A * | 12/2000 | Zory, Jr. ....................... 372/46 |
| 6,285,694 B1 * | 9/2001 | Shigihara ...................... 372/45 |
| 6,650,671 B1 * | 11/2003 | Garbuzov et al. ............. 372/45 |
| 6,731,663 B1 | 5/2004 | Kasukawa et al. ............ 372/45 |
| 2002/0117680 A1 | 8/2002 | Yabusaki et al. ............. 257/101 |

FOREIGN PATENT DOCUMENTS

| | | |
|---|---|---|
| EP | 0 790 685 B1 | 11/2001 |
| WO | WO 96/08062 | 3/1996 |

OTHER PUBLICATIONS

G. Iordache et al., *High power CW output from low confinement asymmetric structure diode laser*, Electronics Letters, vol. 35, No. 2, Jan. 21, 1999, pp. 148-149.

G.M. Smith et al., *Metallization to asymmetric cladding separate confinement heterostructure lasers*, Applied Physics Letter, vol. 67, No. 26, Dec. 25, 1995, pp. 3847-3849.

(Continued)

*Primary Examiner*—Minsun Oh Harvey
*Assistant Examiner*—James Menefee
(74) *Attorney, Agent, or Firm*—Knobbe, Martens, Olson & Bear, LLP

(57) ABSTRACT

A diode laser having a plurality of layers including a thin (e.g., about 0.3 μm or less) p-type cladding layer, the plurality of layers having a substantially asymmetric refractive index profile with respect to the layer growth direction to produce an optical field distribution with a larger fraction of the distribution in n-type layers than in p-type layers of the laser. The layers can be configured to produce a ridge diode laser having an internal loss less than about 3 cm$^{-1}$, and able to generate an approximately 980 nm laser beam with a transverse divergence of about 28° or less, and a spot size of about 0.8 μm or more.

24 Claims, 6 Drawing Sheets

OTHER PUBLICATIONS

C.H. Wu et al., *Characterization of Thin p-Clad InGaAs Single-Quantum-Well Lasers*, IEEE Photonics Technology Letters, vol. 7, No. 7, Jul. 1995, pp. 718-720.

C.H. Wu et al., *Contact Reflectivity Effects on Thin p-Clad InGaAs Single Quantum-Well Lasers*, IEEE Photnoics Technology Letters, vol. 6, No. 12, Dec. 1994, pp. 1427-1429.

Malag, et al., *MOVPE-grown (AlGa) As double-barrier multiquantum well (DBMQW) laser diode with low vertical beam divergence*, Journal of Crystal Growth, vol. 170, 1997, pp. 408-412.

Sebastian, et al., *High-Power 810-nm GaAsP-AlGaAs Diode Lasers With Narrow Beam Divergence*, IEEE Journal on Selected Topics in Quantum Electronics, vol. 7, No. 2, Mar./Apr. 2001, pp. 334-339.

Temmyo et al., *Design of high-power strained InGaAs/AlGaAs quantum-well lasers with a vertical divergence angle of 18°*, Electronics Letters, vol. 31, No. 8, Apr. 13, 1995, pp. 642-644.

V. Vusirkala et al., *GaAs-AlGaAs QW Diluted Waveguide Laser with Low-Loss, Alignment-Tolerant Coupling to a Single-Mode Fiber*, IEEE Photonics Technology Letters, vol. 8, No. 9, Sep. 1996, pp. 1130-1132.

Park, et al., *Kink and beam steering free 0.98 µm high-power RWG lasers with partially ion implanted channels*, Electronics Letters, vol. 34, No. 6, Mar. 19, 1998, pp. 562-563.

Deléphine, et al., *0.7w in singlemode fibre from 1.48 µm semiconductor unstable-cavity laser with low-confinement asymmetric epilayer structure*, Electronics Letters, vol. 36, No. 3, Feb. 3, 2000, pp. 221-223.

Gérard, et al., *Single Transverse-Mode Filtering Utilizing Ion Implantation: Application to 1.48-µm Unstable-Cavity Lasers*, IEEE Photonics Technology Letters, vol. 12, No. 11, Nov. 2000, pp. 1447-1449.

Deléphine, et al. *How to Launch 1 W Into Single-Mode Fiber From a Single 1.48-µm Flared Resonator*, IEEE Journal on Selected Topics in Quantum Electronics, vol. 7, No. 2, Mar./Apr. 2001, pp. 111-123.

U.S. Appl. No. 10/406,808, filed Apr. 3, 2003.

U.S. Appl. No. 10/406,804, filed Apr. 3, 2003.

* cited by examiner

THIN CLAD DIODE LASER

FIELD OF THE INVENTION

The present invention relates to a diode laser with a thin p-type confinement or cladding layer.

BACKGROUND

Diode laser structures with thin p-type cladding or confinement layers have been developed to simplify the fabrication of distributed feedback and ridge waveguide lasers. The thin p-type confinement or 'p-clad' layer (approximately 0.3 $\mu$m compared with the standard thickness of approximately 1–1.5 $\mu$m) allows the optical mode to have sufficient amplitude at the top surface of the structure to achieve the desired grating coupling by relatively shallow etching at the top surface and without requiring regrowth, which is especially difficult for Al-containing materials. For typical ridge waveguide diode lasers with injection stripe widths of about 2–4 micrometers ($\mu$m), the shallowness of the etch significantly reduces underetch. This improves the series resistance of the device. Moreover, the tolerance on the thickness of the material that remains above the active layer and outside the ridge area after etching is very tight, typically only a few tens of nanometres. With a conventional diode laser structure, this typically corresponds to an etch depth greater than about 1 $\mu$m, and it is very difficult to etch the thick cladding layer with sufficient uniformity to meet these tolerances. In contrast, a thin p-clad laser structure requires an etch depth of only about 0.3 $\mu$m, significantly reducing variations in waveguiding due to variations in etch depth, and thus improving the kink-free operation of the laser.

However, prior art thin p-clad structures have been characterised by large optical losses of $\alpha \approx 10$ per centimeter (cm$^{-1}$) or more. Additionally, the transverse (vertical) divergence generally exceeds about 40° due to a need to confine the optical field to reduce absorption in the metal and p$^{++}$ GaAs contact layers. A structure with low loss (e.g., below about 3 cm$^{-1}$) and reduced divergence is desirable for efficient operation of pump lasers for erbium-doped fiber amplifiers, the main application of 980 nanometer diode lasers. It is desired, therefore, to provide a thin clad diode laser that alleviates one or more of the above difficulties, or at least a useful alternative to existing diode lasers.

SUMMARY OF THE CERTAIN INVENTIVE ASPECTS

In accordance with one aspect of the present invention, there is provided a diode laser having a plurality of layers including a thin p-type cladding layer, the plurality of layers having a substantially asymmetric refractive index profile with respect to a growth direction of the layers to produce an optical field distribution with a larger fraction of the distribution in n-type layers than in p-type layers of the laser.

Preferably, the thickness of the cladding layer is substantially less than about 1 $\mu$m.

More preferably, the thickness of the cladding layer is at most about 0.3 $\mu$m.

Preferably, the plurality of layers is configured so that the internal loss of the laser is less than about 3 cm$^{-1}$.

Preferably, the plurality of layers is configured so that the divergence of the beam generated by the laser is at most about 28° in the growth direction.

Various preferred embodiments of the invention provide improved structures for thin p-type clad ridge waveguide diode lasers, including an asymmetric structure that reduces the fraction of the optical field distribution in the top p-type thin-clad regions, the field being largely spread in the n-type regions. For the same thickness of the thin p-clad layer (generally about 0.3 $\mu$m), this asymmetric structure achieves significantly lower optical loss (less than about 3 cm$^{-1}$) than prior art symmetric structures. The n-type regions have lower free carrier attenuation than the p-type regions and much higher carrier mobility. Furthermore, reducing the optical field in the p-type contact layer of a thin clad laser also reduces the optical field in any metal contact layers on the p-type contact layer, further reducing absorption. Thus, in comparison with a symmetric structure, it is possible to extend further the optical field distribution in the asymmetric structure while maintaining low values for internal loss and series resistance.

This also provides a lower beam divergence of the far field optical distribution in the (vertical) transverse or growth direction, significantly improving optical fiber coupling. Generally, this divergence is about 40° in prior art thin p-clad laser diodes, while the asymmetric structure of the preferred embodiment described below has a divergence of only about 28°. In addition, this asymmetric structure is suited to high power operation, because the confinement factor of the active region is reduced in comparison to symmetric structures, thus providing a higher value of the maximum available power before catastrophic optical damage (COD). The laser beam spot size is given by $$\frac{d}{\Gamma} = 0.8 \ \mu m,$$

where d is the thickness of the active region and $\Gamma$ is the confinement factor of the active region for the thin p-clad asymmetric structure, while typical values for prior art high power lasers are $$\frac{d}{\Gamma} = 0.4 - 0.6 \ \mu m.$$

Preferably, the laser includes a ridge, an electrically insulating layer substantially adjacent the ridge, an adhesion layer over the insulating layer, and a metal contact layer over the adhesion layer and the ridge that contacts the ridge, wherein the adhesion layer provides adhesion of the metal contact layer to the laser.

Preferably, the contact metal comprises unalloyed Au.

Preferably, the adhesion layer includes Ti. More preferably, the adhesion layer includes Ti and Pt. Even more preferably, the adhesion layer includes Ti, Pt and Au.

Another aspect of the invention also provides a diode laser, including a ridge, an electrically insulating layer substantially adjacent the ridge, an adhesion layer over the insulating layer, and an unalloyed Au contact layer over the adhesion layer and the ridge that contacts the ridge, wherein the adhesion layer provides adhesion of the unalloyed Au contact layer to the laser.

Preferably, the adhesion layer includes Ti. More preferably, the adhesion layer includes Ti and Pt. More preferably, the adhesion layer includes Ti, Pt and Au.

In another aspect of the invention, a metallization scheme is provided that achieves both good adherence to the insulator layers used to define the injection stripe in the ridge waveguide, and a non-alloyed Au metal contact in the ridge region. Au is used because if other metals such as Ti, Cr or Pt are used in the metallization, the attenuation factor becomes undesirably large because the real part of the refractive index of these metals is large. However, Au alone does not adhere well to insulators, making further mounting or wire bonding extremely difficult and non-uniform.

BRIEF DESCRIPTION OF THE DRAWINGS

Preferred embodiments of the present invention are hereinafter described, by way of example only, with reference to the accompanying drawings, wherein.

DETAILED DESCRIPTION OF CERTAIN INVENTIVE EMBODIMENTS

Figure 1:
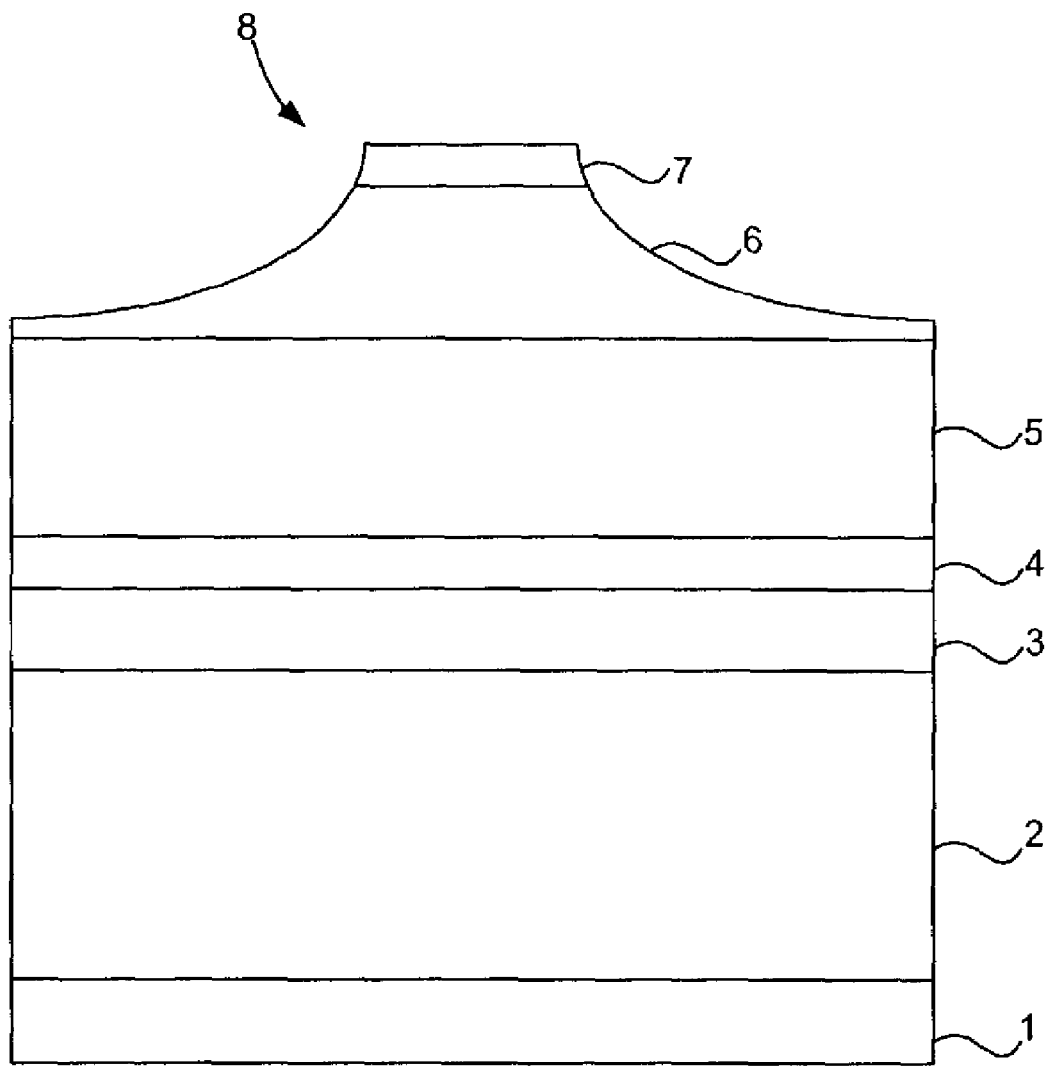
FIG. 1 is a schematic diagram of a preferred embodiment of a thin clad ridge diode laser structure.

A ridge diode laser, as shown in FIG. 1, includes an active layer 5, a separation layer 4, and an optical trap layer 3. These layers 3 to 5 are located between a top p-type confinement or cladding layer 6, and a bottom n-type confinement layer 2. Electrical contact to the laser ridge 8 is facilitated by a $p^{++}$ GaAs contact layer 7. The layers 2 to 7 are grown on top on an $n^{++}$ GaAs substrate wafer 1 by a suitable epitaxial method such as metal-organic chemical vapor deposition (MOCVD), molecular beam epitaxy (MBE), or chemical beam epitaxy (CBE). Table 1 provides more detail of the diode laser structure, including the purpose, composition, thickness, conductivity type, and doping concentration of each layer, including spacer and grading layers not shown in FIG. 1. With the exception of the $In_{0.2}Ga_{0.80}As$ quantum wells in the active layer 5, the compositions are indicated by the fractional content x of Al in the grown $Al_xGa_{1-x}As$ layers. In the described embodiment, the composition and thickness of the quantum wells in the active layer 5 were selected to generate photons with a wavelength of approximately 980 nanometers (nm) for optical pumping of erbium-doped fiber amplifiers for optical communications. However, it will be apparent that alternative compositions and thicknesses can be used to generate photons at other wavelengths for alternative applications.

The ridge structure 8 is fabricated by photolithography and masked wet or dry chemical etching through the contact layer 7 and into the p-type confinement layer 6 to produce an elongated ridge 8 with a width of about 3–4 $\mu$m and a length (into the page in FIG. 1) of approximately 1–2 mm. However, it will be appreciated that the width and length of the ridge 8 can be selected according to the desired characteristics of the laser. For example, in the case of a ridge diode laser operating at about 980 nm, ridge widths of about 2–4 $\mu$m are used to fabricate single mode lasers, whereas ridge widths of about 50–200 $\mu$m are used to fabricate multi-mode lasers. Similarly, ridge lengths greater than about 1 mm are preferable for high power lasers to achieve greater cavity gain relative to mirror losses, whereas shorter ridge lengths can be used for lasers operating at relatively low powers.

After forming the ridge 8, and without removing the photoresist, $SiO_2$ (not shown in FIG. 1) is deposited by plasma-enhanced chemical vapor deposition (PECVD), and an insulator lift-off process is used to remove the $SiO_2$ from the ridge 8. A multi-step metallization process is used to provide electrical contact to the laser ridge 8, as described below.

Figure 2:
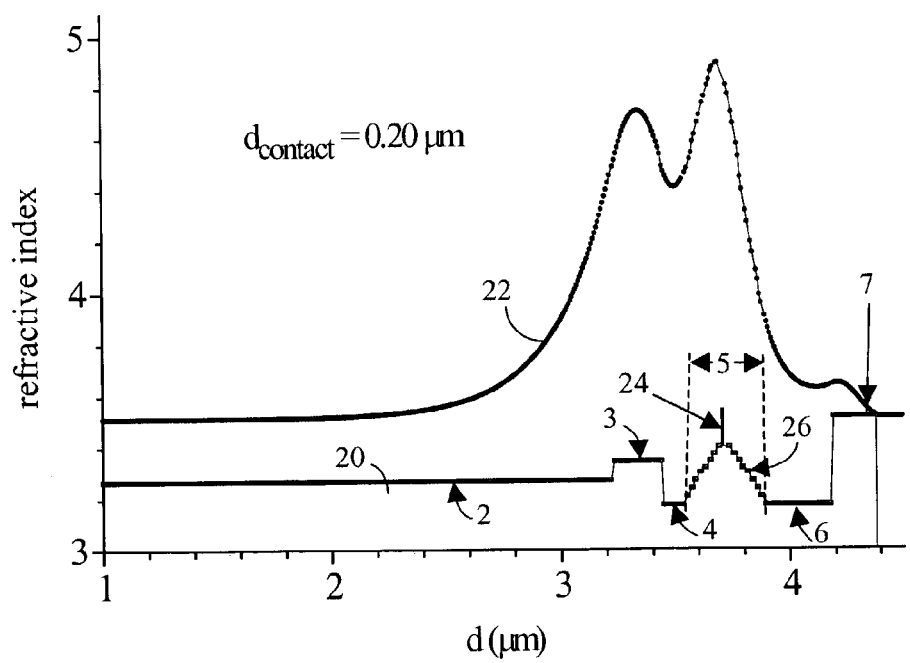
FIGS. 2 and 3 are graphs of the optical field strength and refractive index in the laser as a function of growth thickness, for a $p^{++}$ contact layer thickness of $d_{contact}$=0.20 $\mu$m and 0.24 $\mu$m, respectively.

The depth profiles of refractive index 20 and optical field distribution 22 in the diode laser of Table 1 are shown as a function of total growth thickness d in FIG. 2. The reference numerals labelling various portions of the refractive index profile 20 are those of the corresponding layers of FIG. 1. The asymmetrical layer structure around the active layer 5 produces an asymmetric refractive index profile 20. In general, regions of relatively high refractive index attract the optical field distribution, whereas regions of relatively low refractive index repel or guide the optical field distribution into the higher refractive index layers. Starting from the right-hand side of FIG. 2 and working towards the left, the region from about 4.2–4.4 $\mu$m in FIG. 2 corresponds to the approximately 0.3 $\mu$m p-type GaAs contact layer 7, and has the highest refractive index, near 3.5, of any layer. The next region, from about 3.9–4.2 $\mu$m in FIG. 2, corresponds to the approximately 0.2 $\mu$m p-type $Al_{0.6}Ga_{0.4}As$ confinement layer 6, with a constant refractive index near 3.2. Below this layer, the refractive index profile of the approximately 0.35 $\mu$m undoped active layer 5 includes narrow spikes 24 of high refractive index corresponding to the active $In_{0.2}Ga_{0.80}As$ quantum wells, surrounded by graded index regions 26. The layers 1 to 4 below the active layer 5 are n-type layers. The layer immediately below the active region 5, near a thickness value of about 3.5 $\mu$m in FIG. 2, is the approximately 0.1 $\mu$m thick $Al_{0.6}Ga_{0.4}As$ separation layer 4. The relatively low refractive index value of this layer, near 3.18, effectively repels the optical field distribution into adjacent layers of higher refractive index. Beneath the separation layer 4, at thickness values of approximately 3.2–3.4 $\mu$m, is the approximately 0.22 $\mu$m thick $Al_{0.3}Ga_{0.7}As$ optical trap layer 3, with a relatively high refractive index value of approximately 3.3. The high refractive index of this trap layer 3 attracts or traps the optical field. Beneath this, at growth thicknesses less than about 3.2 $\mu$m in FIG. 2, is the approximately 2.7 $\mu$m $Al_{0.45}Ga_{0.55}As$ n-type confinement layer 2, with a constant refractive index near 3.28, and finally the $n^{++}$ GaAs substrate 1.

TABLE 1

| layer number | layer purpose | Al content | thickness (μm) | type | doping (cm$^{-3}$) |
|---|---|---|---|---|---|
| 7 | p$^{++}$ contact | 0.00 | 0.20 | $^{++}$p$^{++}$ | >5 × 10$^{18}$ |
| 6 | p confinement | 0.60 | 0.30 | p | 5 × 10$^{17}$ |
| 5 | grading | 0.60→0.20 | 0.16 | — | undoped |
|   | spacer | 0.00 | 0.0018 | — | undoped |
|   | active | | 0.006 | — | undoped |
|   | In$_{0.20}$Ga$_{0.80}$As | | | | |
|   | spacer | 0.00 | 0.0018 | — | undoped |
|   | barrier | 0.20 | 0.006 | — | undoped |
|   | spacer | 0.00 | 0.0018 | — | undoped |
|   | active | | 0.006 | — | undoped |
|   | In$_{0.20}$Ga$_{0.80}$As | | | | |
|   | spacer | 0.00 | 0.0018 | — | undoped |
|   | grading | 0.20→0.60 | 0.16 | — | undoped |
| 4 | separation | 0.60 | 0.10 | n | 10$^{17}$ |
|   | grading | 0.60→0.30 | 0.02 | n | 10$^{17}$ |
| 3 | optical trap | 0.30 | 0.22 | n | 10$^{17}$ |
|   | grading | 0.30→0.45 | 0.01 | n | 10$^{17}$ |
| 2 | n confinement | 0.45 | 0.70 | n | 5 × 10$^{17}$ |
|   | n confinement | 0.45 | 2.00 | n | 10$^{18}$ |
| 1 | n$^{++}$ substrate | 0.00 | | $^{++}$n$^{++}$ | |

The corresponding optical field depth distribution 22 within the laser, also shown in FIG. 2, is quite broad, with a total extent of at least about 3 μm in the layer growth direction. The asymmetric refractive index profile 20 produces an asymmetric optical field distribution 22 that is mostly spread in the n-type layers 2 to 4 of the laser and less spread in the p-type layers 6,7. This broad, asymmetric optical field distribution 22 has two beneficial aspects: first, the optical loss of the laser is reduced by skewing the field to the n-type layers 2 to 4 of the structure because free carrier absorption by electrons is about half that of holes. Second, the series resistance of the laser diode is largely determined by the p-type layers 6,7 because the mobility of holes is significantly lower than that of electrons. Consequently, another effect of skewing the optical field out of the p-type layers 6,7 and into the n-type layers 2 to 4 is to lower the series resistance of the laser. Thus, in contrast to symmetric diode lasers, the optical field distribution is spread in the transverse (growth) direction without incurring unacceptable increases of the intrinsic optical loss and/or series resistance.

A major challenge for fabricating thin p-clad diode laser structures with performance equal to that of thick p-clad conventional structures is modal attenuation due to the extension of the optical field distribution 22 into the p$^{++}$ GaAs contact layer 7 and metal layers. The typical thickness of the p-type cladding layer 6 in a conventional structure is about 1–1.5 μm, but in the thin p-clad structure of the preferred embodiment, this thickness is only about 0.3 μm. The decay of the optical field distribution 22 in the p-type confinement layer 6 is exponential, and the optical field distribution would be perturbed by any subsequent layer whose real part of the refractive index was larger than the effective refractive index $n_{eff}$ at the intended lasing wavelength. In the described embodiment of a laser operating at about 980 nm, $n_{eff} \approx 3.28$. Consequently, such perturbing layers include the p$^{++}$ GaAs layer 7 (n≈3.5–3.6 at about 980 nm) that enables a p-type ohmic contact, and any metal contact layers (e.g., Ti, Pt, Cr) whose real part of the refractive index is higher than the effective refractive index of about 3.28. Generally, a metal contact layer is deposited by sequential electron-beam evaporation of Ti, Pt, and Au. The Ti provides good adhesion to an oxide layer (not shown) deposited over the etched confinement layer 6, the Au ensures good electrical contact to the p$^{++}$ GaAs contact layer 7, and the Pt acts as a diffusion barrier between the Ti and the Au.

For example, Table 2 shows the real and the imaginary components of refractive index of the three metals Ti, Pt and Au at a photon energy of about 1.20 eV, corresponding to a wavelength of about 1.033 μm, slightly longer than the laser operating wavelength of about 980 nm. For comparison, the real component of the refractive index of GaAs is about $n_r$=3.5, and the imaginary component, corresponding to free carrier absorption in highly doped GaAs, is about $n_i$=−0.002. Because the real components of refractive index of the three metals are fairly close to the value for GaAs, and the imaginary refractive index components of the metals, representing absorption, are extremely high, even layers as thin as a few tens of nanometers of Ti or Pt can significantly affect the absorption coefficient in the laser structure. Due to the significantly lower value of the real part of the refractive index of Au, the optical field is effectively pushed away, and the resulting absorption coefficient is significantly less than for the standard combination of Ti/Pt/Au. For the asymmetric thin p-type clad structure, the modal absorption coefficient is only 0.3 cm$^{-1}$ when only Au is used, whereas a value of about 7.3 cm$^{-1}$ is obtained for the Ti/Pt/Au combination.

TABLE 2

| | refractive index | |
|---|---|---|
| Contact Metal | Real part $n_r$ | Imaginary part $n_I$ |
| Titanium | 3.35 | −3.30 |
| Platinum | 3.55 | −5.92 |
| Gold | 0.10 | −6.54 |

Figure 3:
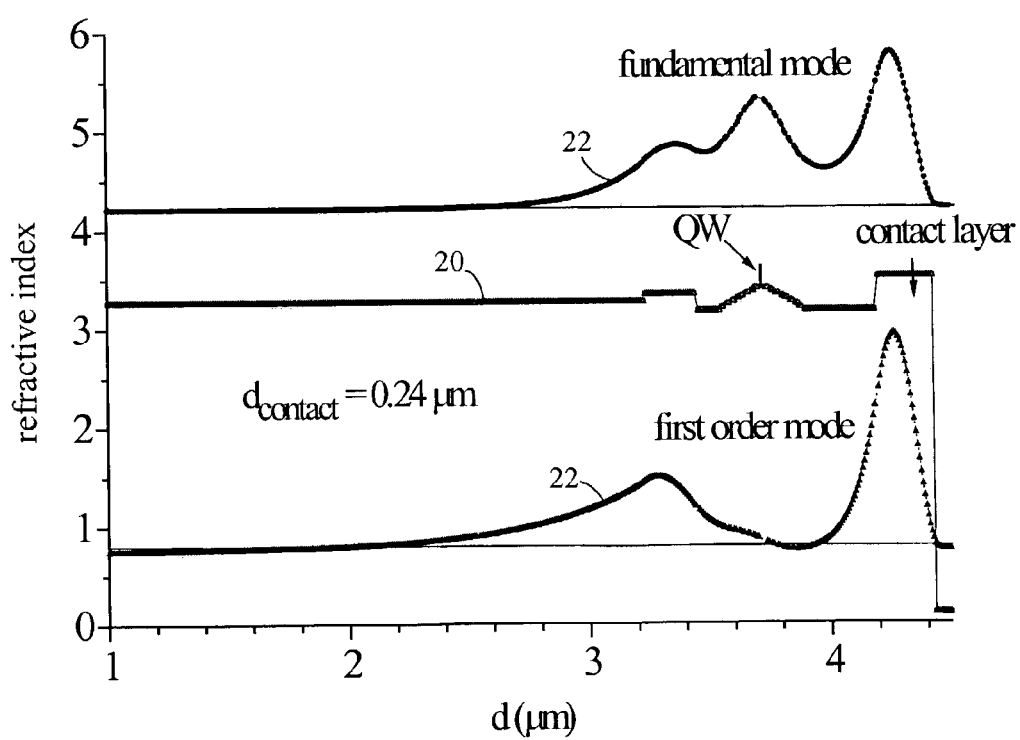
Figure 4:
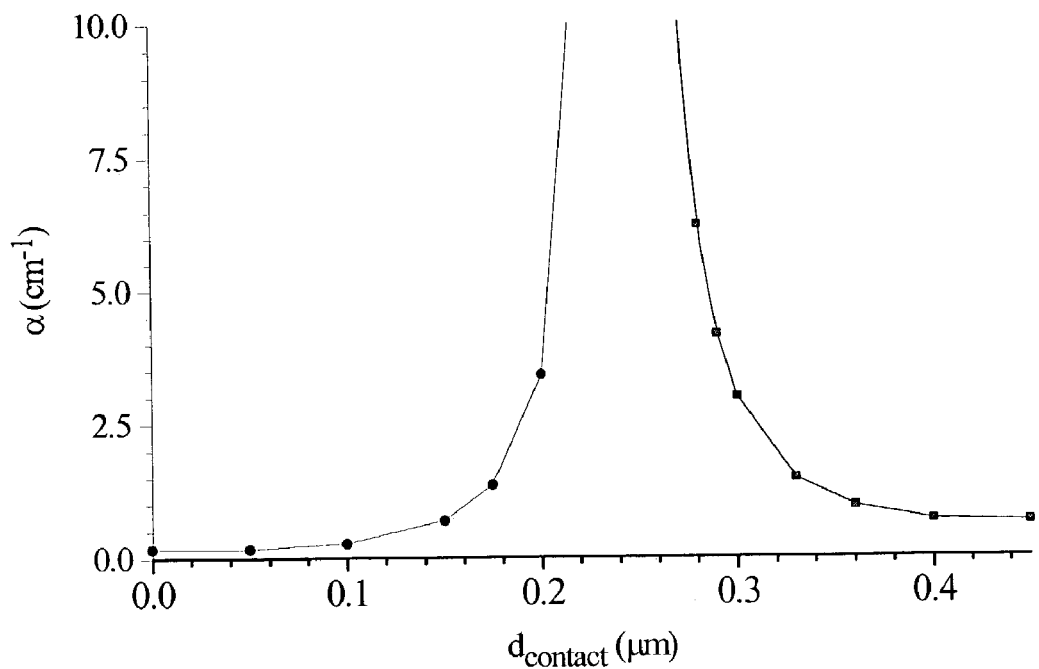
FIG. 4 is a graph of the modal attenuation coefficient due to field extension in the Au metal and $p^{++}$ GaAs contact layers as a function of the thickness of the $p^{++}$ GaAs contact layer of the laser.

However, notwithstanding its low real component of refractive index, even if Au is used as a p-type metallization layer, the p-type contact layer 7 acts as an unwanted second waveguide that can couple a significant portion of the optical field out of the active layer 5. However, this is a resonant effect that is strongly dependent on the thickness of the contact layer 7, as shown in FIGS. 2 to 4. FIGS. 2 and 3 show the refractive index and optical field depth profiles for laser diode structures having contact layer thicknesses of about 0.20 and 0.24 μm, respectively. As described above, regions with higher refractive index trap the optical field, while regions with low refractive index ensure the proper waveguiding. FIG. 2 shows the optical field distribution as intended, with the lasing mode spread asymmetrically, largely in the n-type regions and much less in the p-type layers. This occurs if the thickness of the p$^{++}$ contact layers stays below about 0.20 μm. However, if the thickness of the p$^{++}$ contact layer 7 is near 0.24 μm, a sharp resonance occurs, and a significant part of the optical field 22 is trapped in the contact layer 7, as shown in FIG. 3, and the mode becomes highly absorptive. FIG. 4 shows this modal loss as a function of the thickness of the p$^{++}$ GaAs contact layer 7, indicating that the absorption resonance occurs for layer thicknesses in the range ≈0.2–0.3 μm. For ridge waveguide diode lasers, the thickness of the contact layer 7 is therefore chosen to avoid the absorptive resonance because the latter introduces unacceptable high losses and distortions of the near and far field optical field distributions. Consequently, it is preferred that the thickness of the GaAs p$^{++}$ contact layer 7 is less than about 0.15 μm for ridge waveguide applications. Conversely, the resonant effect can be exploited to create periodical variations of loss and effective refractive index simply by making corrugations in the contact layer 7 along the light propagation direction. These effects stabilize the lasing wavelength, making the laser diode suitable for a different class of applications.

Figure 5:
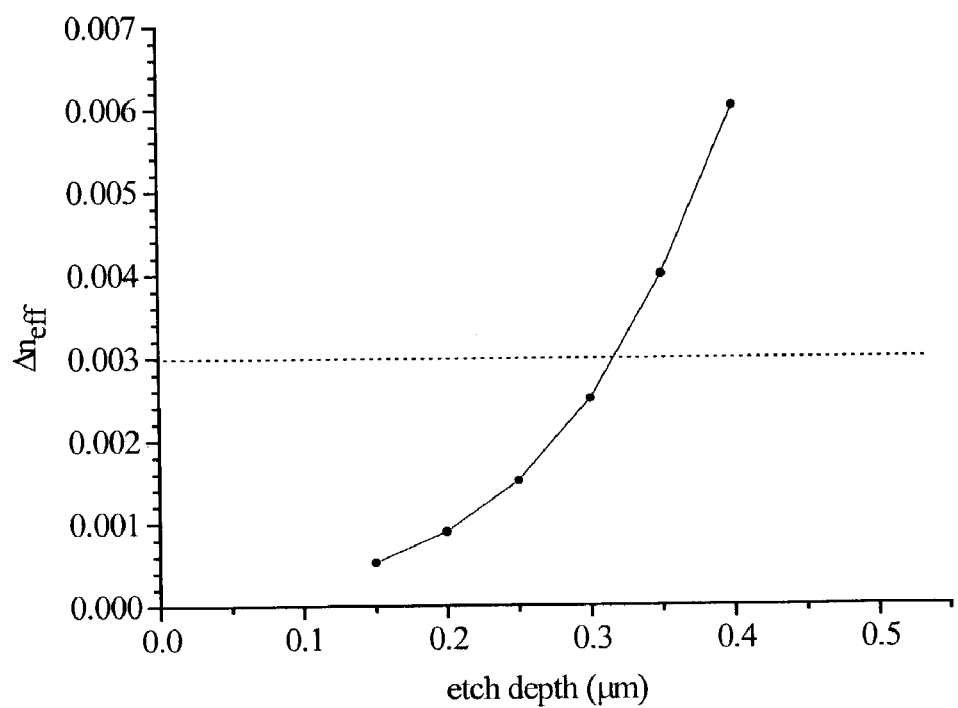
FIG. 5 is a graph of the amount of lateral waveguiding $\Delta n_{eff}$ in the laser as a function of etch depth.

The lateral confinement in a ridge laser is obtained by forming a physical ridge by etching the grown layer structure, as described above. This confinement is referred to as index guiding. FIG. 5 is a graph of the amount of lateral index guiding $\Delta n_{eff}$ achieved by etching the p-type side of the laser structure as a function of the etch depth, for the laser structure of Table 1. The targeted value is $\Delta n_{eff} \approx 3 \times 10^{-3}$, corresponding to an etch depth of about 0.3 $\mu$m. From FIG. 5, it is clear that about 10% variations in etch depth (i.e., about 0.03 $\mu$m) across the wafer do not significantly affect the amount of lateral waveguiding. In contrast, a typical conventional structure requires an etch depth of more than 1 $\mu$m. In such a structure, etch depth variations of about 10% (i.e., about 0.1 $\mu$m) will have a significant effect on the degree of lateral waveguiding, and therefore the stability of the lateral mode, thus reducing the yield of kink-free, single lateral-mode devices when such devices are fabricated.

Figure 6:
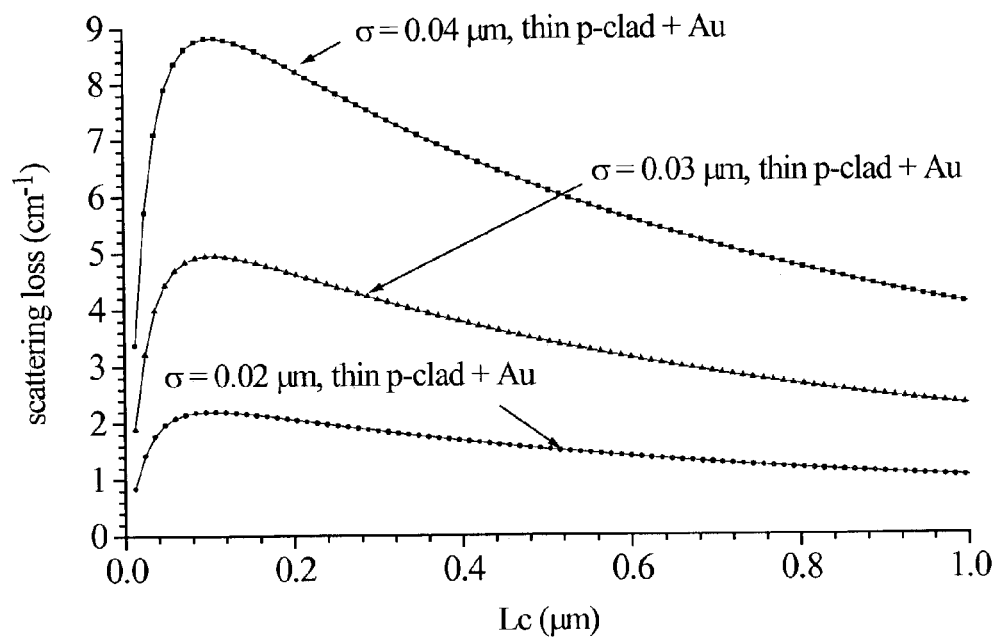
FIG. 6 is a graph of the calculated scattering loss at the rough interface between the Au metal contact and the $p^{++}$ GaAs contact layer of the laser as a function of autocorrelation length $L_c$ for different values of the interface roughness $\sigma$.

The metallization scheme used to deposit contact metals on the laser structure poses further difficulties. After deposition of an appropriate metal contact layer, it is necessary to anneal the n-type contact to make it Ohmic, with a heat treatment generally being approximately 430° C. for about 1 minute. However, if the p-type metallization is annealed, the interface between the metal contact layer and the $p^{++}$ GaAs contact layer 7 roughens, and the resulting internal loss of the thin p-type clad diode laser can be unacceptably high. This occurs even if Au is used as the metal for the p-type ridge contact, despite the apparent absence of phases such as AuGa that may possibly absorb at the laser's operating wavelength. FIG. 6 is a graph of the calculated optical losses induced by scattering at the rough interface between the metal (Au) layer and the $p^{++}$ GaAs contact layer 7 as a function of the auto-correlation length Lc (i.e., the average spacing between roughness features), with the roughness $\sigma$ of the interface (i.e., the height of the roughness features) as a parameter. The calculations indicate that interface roughness is sufficient to explain the observed losses.

It was found that non-alloyed Au p-type contacts display Ohmic behavior even as deposited, without further annealing. It is therefore advantageous if the processing of the laser diode is made in such a way that an Ohmic heat treatment is performed for the n-type metallization, but not for the p-type metals. However, a major difficulty of using only Au as the p-type contact metal is that it does not adhere to the insulator used to restrict current flow outside the ridge area. This prevents the use of standard and reliable mounting procedures, resulting in catastrophic device failure under continuous wave (CW) conditions.

Figure 7:
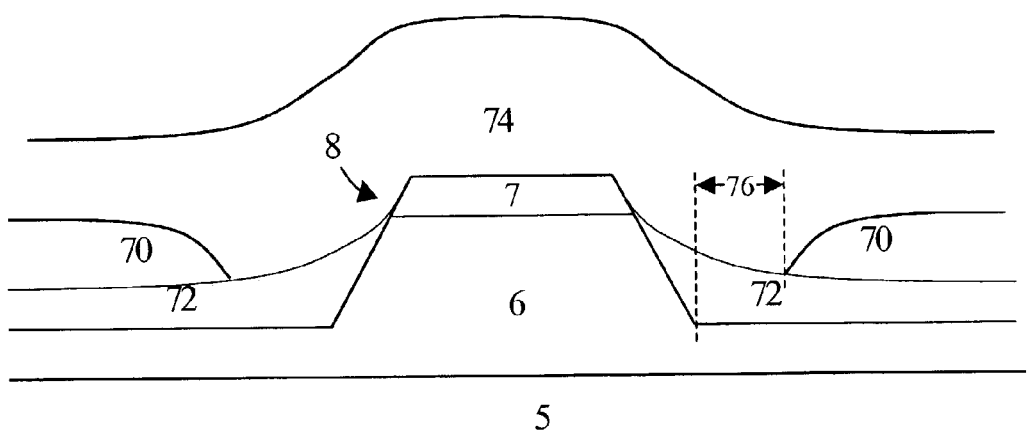
FIG. 7 is a schematic illustration of the metallization scheme used to provide adequate adhesion of Au to the laser's insulator layer and to restrict interaction of the optical field to be with un-alloyed Au.

To alleviate the above difficulties, a p-type metallization process, as described below, is used to form the ridge contact structure shown in FIG. 7. In this process, a Ti/Pt/Au lift-off step is performed prior to Au deposition, so that a Ti/Pt/Au layer 70 extends over most of the insulator area 72, but not over the ridge 8, where it would strongly affect the optical field distribution and introduce unacceptably large losses. However, the Ti/Pt/Au layer 70 adheres well to the insulator 72, and a subsequently deposited Au layer 74 adheres well to the Ti/Pt/Au layer 70. The process therefore results in good adherence of the Au layer 74 to the laser diode structure. Because the Au contact 74 is not annealed, the process does not result in large optical losses in the Au contact 74 above the ridge structure 8.

The major steps of the p-type metallization process in one example are as follows:
(i) standard photolithography of ridge stripes (about 2–4 $\mu$m for a single mode laser; about 50–200 $\mu$m for a multi-mode laser), wet or dry etching to form the ridge 8, followed by insulator (e.g., PECVD SiO$_2$) deposition and subsequent lift-off to expose the $p^{++}$ contact layer 7 on the ridge 8;
(ii) Ti/Pt/Au (approximately 10–40 nm/20 nm/50–100 nm, respectively) lift-off metallization. The deposited Ti/Pt/Au surrounds the ridge 8 symmetrically. The width 76 of the region uncovered by the Ti/Pt/Au (i.e., the gap between the nearest edges of the ridge 8 and remaining part of the Ti/Pt/Au layer) is about 10–100 $\mu$m for an approximately 2–4 $\mu$m ridge, and about 100–500 $\mu$m for an approximately 50–200 $\mu$m ridge;
(iii) the n-side of the laser structure is polished, bringing the device thickness of the structure down to about 100 $\mu$m;
(iv) standard Au/Ge/Ni metallization on the n-side;
(v) heat treatment for about 1 min at approximately 430° C. to make the n-type contact Ohmic; and then
(vi) deposition (about 100–300 nm) of the Au contact layer 74 on the p-side of the structure.

Figure 8:
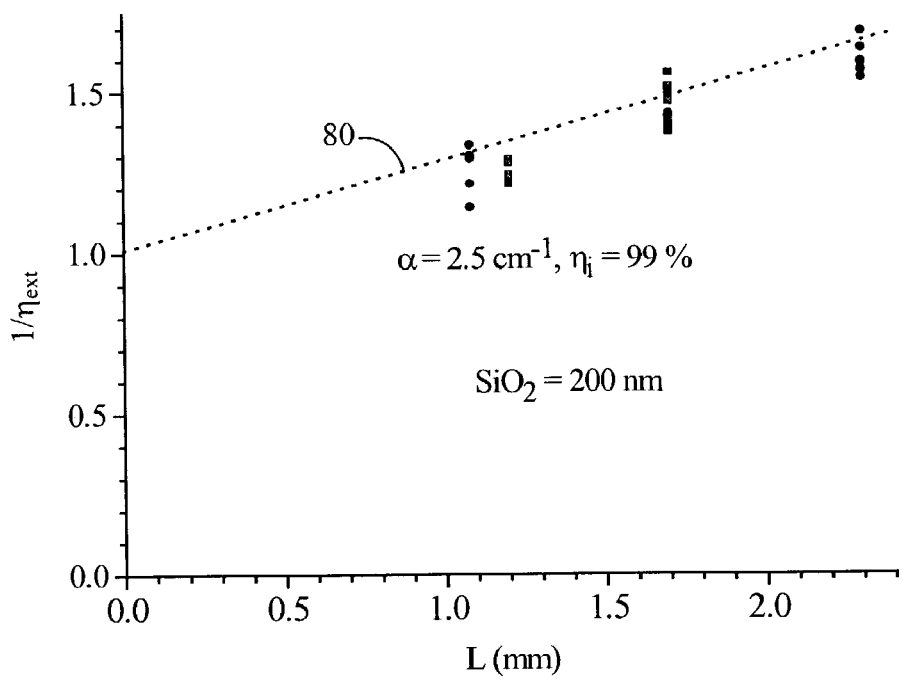
FIGS. 8 and 9 are graphs of the reciprocal of differential efficiency $\eta_{ext}$ as a function of laser ridge length using unalloyed and alloyed Au, respectively, as a top metal ohmic contact.
Figure 9:
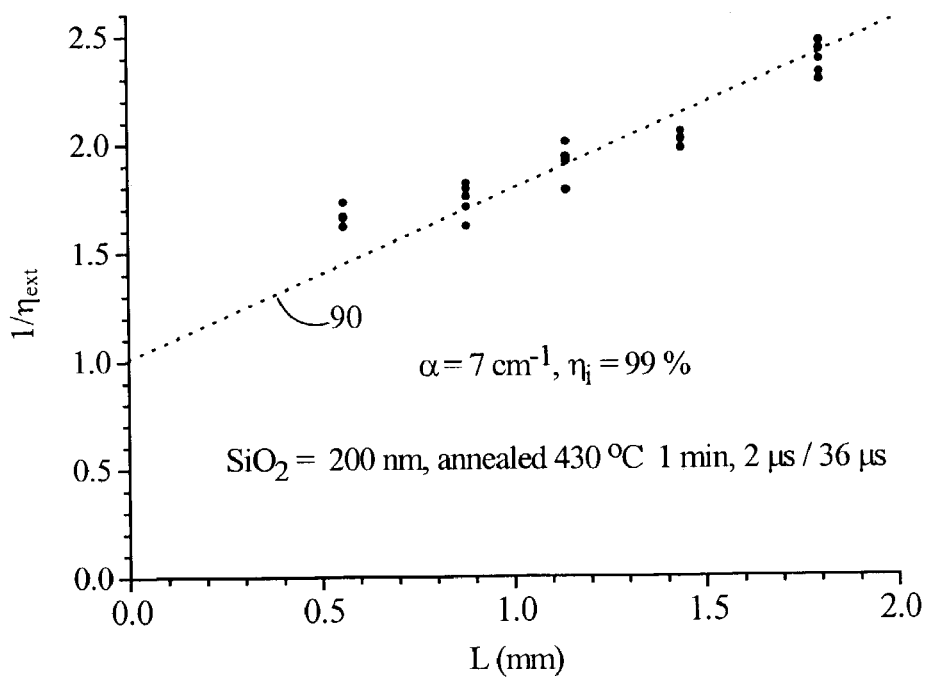

FIG. 8 is a graph of the reciprocal of the differential efficiency $\eta_{ext}$ as a function of device length for laser devices having the asymmetric thin p-type clad laser structure. The dashed line 80 is a fit to the data, and corresponds to an internal loss of only about 2.5cm$^{-1}$, essentially the same value as for a standard thick p-type cladding structure. This low value results from the fact that the optical field is largely extended in the n-type layers 2 to 4 of the structure and much less in the p-type layers 6, 7. This also allows a relatively low value of the transverse (growth direction) beam divergence of only about 28° to be obtained. FIG. 9 is a similar graph for devices that have been given an additional Ohmic heat treatment for the p-type contact for comparison. The dotted line fit 90 corresponds to an internal optical loss of about 7 cm$^{-1}$, significantly higher than the optical loss in unannealed devices, presumably due to scattering at the rough interface, as suggested by the data of FIG. 6.

Figure 10:
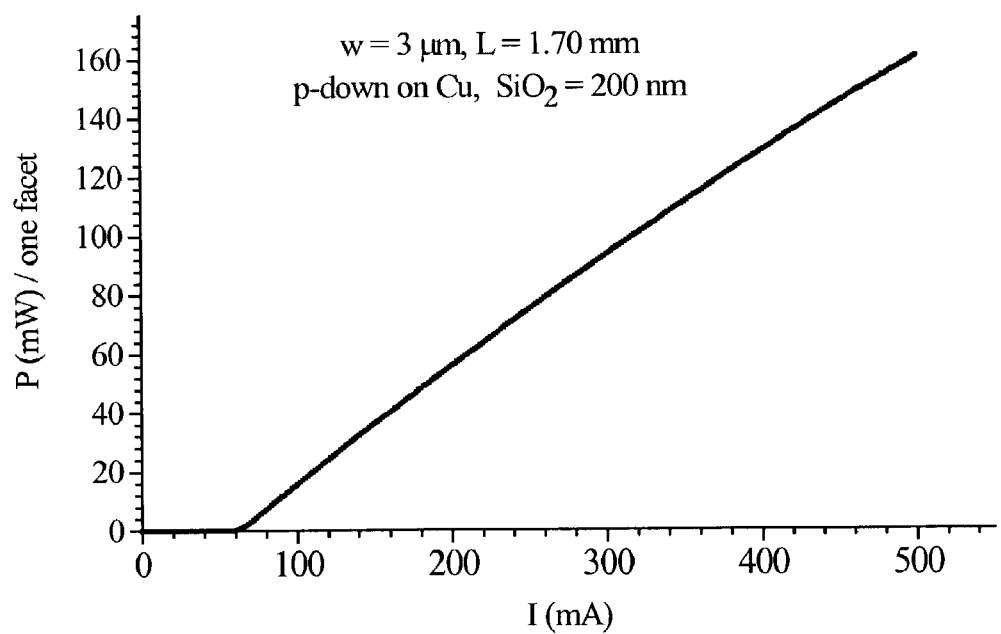
FIG. 10 is a graph of the kink-free P-I curve of the laser with length L=1.7 millimeters (mm).

FIG. 10 is a graph of the optical CW power per facet as a function of injection current (P-I plot) for a diode laser having a ridge width of about 3 $\mu$m and a device length of approximately 1.75 mm, showing kink-free operation for optical output powers in excess of about 300 milliwatts (mW).

These characteristics have been determined by the particular asymmetric layer structure shown in Table 1. However, it will be apparent to one skilled in the art that many possible layer structures can be used to provide similar benefits. Due to the complex nature of diode laser physics, it is not generally possible to define strict rules for determining which layer structures will provide the desired characteristics for a given application. Ultimately, the characteristics of a particular layer structure may be simulated using standard transfer matrix calculations, such as described in K. H. Schlereth and M. Tacke, *The Complex Propagation of Multilayer Waveguides: an Algorithm for a Personal Computer*, IEEE Journal of Quantum Electronics, Vol. 26, p. 627 (1990) ("Schlereth").

Notwithstanding the above, it is possible to state a number of design guidelines that can be used to reduce the time required to design a laser structure with good performance characteristics, such as the structure of the preferred embodiment. For example, the following procedure can be used to determine a suitable structure:

(i) Design an asymmetric layer structure for the diode laser. In addition to an active layer for generating the optical field, the structure preferably includes a trap layer for attracting the optical field, and a separation layer of very low refractive index between the active layer and the trap layer for repelling the optical field. Additional trap layers can, of course, be included, but a simple structure is generally preferred, to reduce the number of (absorptive) layer interfaces, for example.

(ii) Include at least one trap layer of high refractive index to skew the optical distribution away from p-type layers and towards n-type layers of the structure. However, the refractive index of the trap layer should not be so high relative to the refractive index of the active layer as to result in a high degree of recombination in the trap layer. This would decrease recombination in the active layer, reducing gain and increasing the threshold current of the laser.

(iii) Ensure that the asymmetric structure is not so asymmetric that it does not support the fundamental mode at the operating wavelength of the laser. This can be achieved by selecting layer parameters to support the fundamental mode, based on numeric modelling of the structure, such as described in Schlereth. Moreover, the fundamental mode should be sufficiently removed from cutoff that technological variations during fabrication are not likely to result in the fundamental mode being cutoff in practice.

(iv) Design the asymmetric layer structure to have low confinement. That is, the optical field distribution should not be too narrow in the growth direction. It will be apparent to one skilled in the art that it is not practical to define this quantitatively due to the complex distributions that can be obtained from multi-layer structures. The spot size $d/\Gamma$ is preferably at least about 0.8 $\mu$m.

(v) Include a confinement layer of low refractive index between the metal contact layer and the other layers of the structure to separate the optical field from the contact layer and metal contact, and thus reduce optical absorption in these layers, which is preferably less than about 0.3 $cm^{-1}$.

(vi) The configuration of the trap layer and the substrate should be such as to keep the optical field sufficiently removed from the substrate to avoid excessive absorption in the latter. A thick confinement layer of low refractive index can be used for this purpose. The optical loss in the substrate is preferably less than about 0.1 $cm^{-1}$.

(vii) The total internal loss in the laser is preferably about 3 $cm^{-1}$ or better. This is determined by (v) and (vi) above, as well as the number of layer interfaces. Additionally, free carrier absorption at high injection levels contributes to the internal loss.

(viii) Bearing in mind the above guidelines, the beam divergence in the transverse (i.e., growth) direction is preferably about 28° or less. As described above, this preferably involves transfer matrix simulation of the structure. If the divergence is too high, then the layer structure is adjusted (e.g., by reducing the confinement of the optical field by broadening a layer of high refractive index, or adding another layer of high refractive index) and the simulation repeated. This iterative procedure can be continued until the divergence is as low as desired.

Many modifications will be apparent to those skilled in the art without departing from the scope of the present invention as herein described with reference to the accompanying drawings.

What is claimed is:

1. A diode laser, including a ridge including a highly doped p-type contact layer over a thin p-type cladding layer, an electrically insulating layer substantially adjacent said ridge, an adhesion layer over said insulating layer, and an unalloyed Au contact layer over said adhesion layer and said ridge that directly contacts said highly doped contact layer of said ridge, wherein the adhesion layer provides adhesion of said unalloyed Au contact layer to said laser, thereby maintaining the direct contact of said unalloyed Au contact layer and said highly doped p-type contact layer of said ridge.

2. A diode laser as claimed in claim 1, wherein the adhesion layer includes Ti.

3. A diode laser as claimed in claim 1, wherein the adhesion layer includes Ti and Pt.

4. A diode laser as claimed in claim 1, wherein the adhesion layer includes Ti, Pt and Au.

5. A diode laser as claimed in claim 1, wherein the diode laser includes a plurality of layers including an active layer for generating said optical field, layers on a first side of said active layer including said thin p-type cladding layer being p-type, and layers on a second side of said active layer being n-type.

6. The diode laser of claim 5, wherein the plurality of layers has a substantially asymmetric refractive index profile with respect to a growth direction of said layers to produce an optical field distribution with a larger fraction of said distribution in n-type layers than in p-type layers of said laser.

7. The diode laser of claim 6, wherein said plurality of layers includes said active layer for generating said optical field, a trap layer for attracting said optical field, and a separation layer between said active layer and said trap layer for repelling said optical field.

8. The diode laser of claim 7, wherein the thin p-type cladding layer is adjacent said active layer, and said plurality of layers includes a second cladding layer adjacent said trap layer to reduce absorption in an adjacent substrate of the diode laser.

9. The diode laser of claim 8, wherein said highly doped p-type contact layer is adjacent said thin p-type cladding layer.

10. The diode laser of claim 9, wherein said trap layer and said second cladding layer are n-type.

11. The diode laser of claim 10, wherein the refractive index of the n-type trap layer is sufficiently high to attract the optical field distribution away from the p-type layers of said diode laser, but not so high relative to the refractive index of the active layer to cause substantial recombination in the n-type trap layer and thereby substantially reduce the gain of said diode laser.

12. The diode laser of claim 6, wherein the thickness of said thin p-type cladding layer is substantially less than about 1 $\mu$m.

13. The diode laser of claim 6, wherein the thickness of said thin p-type cladding layer is at most about 0.3 $\mu$m.

14. The diode laser of claim 6, wherein said plurality of layers is configured so that the internal loss of said laser is less than about 3 $cm^{-1}$.

15. The diode laser of claim 14, wherein said plurality of layers is configured so that the divergence of the beam generated by said laser is at most about 28° in said growth direction.

16. The diode laser of claim 15, wherein said plurality of layers is configured so that the spot size of the beam generated by said laser is at least about 0.8 µm.

17. The diode laser of claim 14, wherein said plurality of layers is configured so that the spot size of the beam generated by said laser is at least about 0.8 µm.

18. The diode laser of claim 6, wherein said plurality of layers is configured so that the divergence of the beam generated by said laser is at most about 28° in said growth direction.

19. The diode laser of claim 18, wherein said plurality of layers is configured so that the spot size of the beam generated by said laser is at least about 0.8 µm.

20. The diode laser of claim 6, wherein said plurality of layers is configured so that the spot size of the beam generated by said laser is at least about 0.8 µm.

21. The diode laser of claim 1, wherein the adhesion layer is substantially spaced from the ridge to reduce optical absorption in the adhesion layer.

22. A diode laser, including a highly doped p-type contact region on a thin p-type cladding layer, an electrically insulating layer disposed about said highly doped contact region, an adhesion layer on said insulating layer, and an unalloyed metal contact layer over said adhesion layer and said highly doped contact region so that said unalloyed metal contact layer directly contacts said highly doped contact region, wherein said adhesion layer provides adhesion of said unalloyed metal contact layer to said diode laser, thereby maintaining the direct contact of said unalloyed metal contact layer to said highly doped contact layer, the adhesion layer being substantially spaced from said highly doped contact region to reduce absorption in said adhesion layer.

23. The diode laser of claim 22, wherein the diode laser includes a plurality of layers including said thin p-type cladding layer, said plurality of layers having a substantially asymmetric refractive index profile with respect to a growth direction of said layers to produce an optical field distribution with a larger fraction of said distribution in n-type layers than in p-type layers of said laser.

24. The diode laser of claim 23, wherein said plurality of layers is configured so that the internal loss of said laser is less than about 3 cm$^{-1}$, the divergence of the beam generated by said laser is at most about 28° in said growth direction, and the spot size of the beam generated by said laser is at least about 0.8 µm.

* * * * *

UNITED STATES PATENT AND TRADEMARK OFFICE
CERTIFICATE OF CORRECTION

PATENT NO.        : 6,993,053 B2
APPLICATION NO. : 10/406806
DATED             : January 31, 2006
INVENTOR(S)       : Buda et al.

It is certified that error appears in the above-identified patent and that said Letters Patent is hereby corrected as shown below:

At column 5 (table 1), line 6, please delete "$^{++}p^{++}$" and insert -- $p^{++}$ --, therefore.

At column 5 (table 1), line 17, please delete "O.60→0.30" and insert -- 0.60→0.30 --, therefore.

At column 5 (table 1), line 21, please delete "$^{++}n^{++}$" and insert -- $n^{++}$ --, therefore.

Signed and Sealed this

Seventeenth Day of April, 2007

JON W. DUDAS
*Director of the United States Patent and Trademark Office*